United States Patent [19]

Shimada et al.

[11] Patent Number: 5,374,835
[45] Date of Patent: Dec. 20, 1994

[54] FIELD EFFECT TRANSISTOR USING COMPOUND SEMICONDUCTOR

[75] Inventors: Kizashi Shimada, Yokohama; Mayumi Kamura; Tatsuo Akiyama, both of Tokyo, all of Japan

[73] Assignee: Kabushiki Kaisha Toshiba, Kawasaki, Japan

[21] Appl. No.: 63,654

[22] Filed: May 20, 1993

[30] Foreign Application Priority Data

May 21, 1992 [JP] Japan ................... 4-128958

[51] Int. Cl.⁵ .................. H01L 29/80; H01L 31/112
[52] U.S. Cl. .................. 257/284; 257/280; 257/282; 257/283
[58] Field of Search ............. 257/260, 280, 282, 283, 257/284

[56] References Cited

U.S. PATENT DOCUMENTS 4,673,960 6/1987 Chao et al. .................... 257/283

OTHER PUBLICATIONS

"0.25–0.1 μm T-shaped gate electrode fabrication by using electron beam direct drawing", Nishida et al., Data of A Research Meeting of Electronics, Information and Communication Engineers of Japan, ED90-92, pp. 37–43, 1990.

Primary Examiner—Steven Ho Yun Loke
Attorney, Agent, or Firm—Finnegan, Henderson, Farabow, Garrett & Dunner

[57] ABSTRACT

A compound semiconductor device such as HEMTs (High Electron Mobility Transistors), metal semiconductor field effect transistors, and the like includes a compound semiconductor substrate having an active region, an insulating film provided over the semiconductor substrate, source and drain electrodes provided on the active region, and a gate electrode located between the source and drain electrodes. In the structure, the gate electrode has a lower electrode portion for providing a Schottky barrier contact with the active region through an opening of the insulating film, and an upper electrode portion provided on the insulating film to extend toward only the drain electrode.

3 Claims, 3 Drawing Sheets

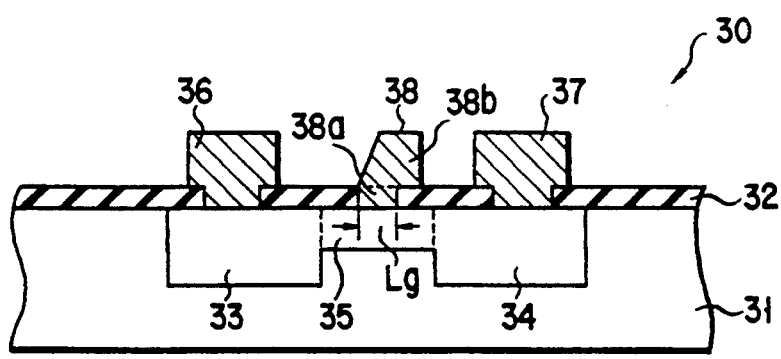
F I G. 3

FIELD EFFECT TRANSISTOR USING COMPOUND SEMICONDUCTOR

BACKGROUND OF THE INVENTION

1. Field of the Invention

The present invention relates to a field effect transistor using a compound semiconductor, and more particularly, to a gate electrode structure of HEMTs (High Electron Mobility Transistors), MESFETs (Metal Semiconductor Field Effect Transistors), and the like.

2. Description of the Related Art

Since a compound field effect transistor is especially used for high-frequency communication, low noise characteristics have been required therefore. FIG. 4 shows a schematic arrangement of a conventional compound field effect transistor. An insulating film 22 is formed on a semiconductor substrate 21 having an electrically isolated active region (not shown). Thereafter, drain and source electrodes 23 and 24 each acting as an ohmic contact and a gate electrode 25 acting as a Schottky gate are provided on the semiconductor substrate 21.

With the recent advance in the fine pattern structures of semiconductor devices, a demand has arisen for a compound semiconductor field effect transistor having a gate length of 0.25 μm or 0.1 μm. However, in the transistor shown in FIG. 4, it is difficult to obtain low noise characteristics because of an increase in the gate resistance of the gate electrode 25.

As shown in FIG. 5, therefore, even in the conventional transistor, the gate electrode 25 having a T-shaped structure in the cross-section has been proposed to increase the cross-sectional area, thereby suppressing an increase in the gate resistance. The characteristics of such a semiconductor device can be expressed by a high-frequency noise figure NF given by the following formula:

$$1 + 2\pi K_F \times f \times C_{gs} \times [(R_s + R_g)/g_m]^{\frac{1}{2}}$$

$K_F$: fitting constant
f: operating frequency
Cgs: gate-source capacitance
Rs: gate-source resistance
Rg: gate resistance
$g_m$: transconductance Assume that the length of an upper electrode portion 25' of the gate electrode 25, which is provided on the insulating film 22 at the side of the source electrode 24, is l; the width of its cross-sectional area, W; the gate length, Lg; the thickness of the insulating film 22, d; the vacuum dielectric constant, $\epsilon_0$; and the dielectric constant of the insulating film 22, $\epsilon$, respectively. In this case, a capacitance increase ΔC due to the formation of the upper electrode portion 25' of the gate electrode 25 on the insulating film 22 is given by $\epsilon_0 \times \epsilon \times W \times Lg/d$. This parasitic capacitance is generated in parallel with the gate-source capacitance Cgs. Therefore, a gate-source capacitance Cgs' of the gate electrode 25 having the T-shaped cross-section becomes Cgs+ΔC. Further, a gate resistance Rg' of the gate electrode 25 having the T-shaped cross-section becomes Rg'=(n$^{-1}$).Rg, provided that the cross-sectional area of the gate electrode 25 is n times larger than that of the gate electrode 25 in FIG. 4.

In the transistor shown in FIG. 5, therefore, the high-frequency noise figure NF can be expressed as follows:

$$1 + 2\pi K_F \times f \times (C_{gs} + \Delta C) \times [(R_s + (n^{-1}).R_g)/g_m]^{1/2}$$

That is, the gate resistance Rg can be reduced by forming the gate electrode 25 as the T-shaped structure in the cross-section. However, since the gate electrode 25 extends to the insulating film 22, the gate-source capacitance Cgs is increased and the high-frequency noise figure NF cannot be effectively reduced.

As described above, the gate resistance can be reduced by forming the gate electrode as the T-shaped cross-section, corresponding to the gate length of the compound semiconductor field effect transistor. However, since the gate-source capacitance Cgs is increased, it is necessary to reduce the gate-source capacitance Cgs in order to obtain higher performance.

SUMMARY OF THE INVENTION

It is an object of the present invention to provide a compound semiconductor field effect transistor having a gate electrode suitable for a fine pattern structure.

It is another object of the present invention to provide a compound semiconductor field effect transistor having a reduced gate resistance Rg.

It is still another object of the present invention to provide a compound semiconductor field effect transistor having a reduced gate-source capacitance Cgs.

According to one aspect of the present invention, there is provided a compound semiconductor device, which comprises a compound semiconductor substrate having an active region, an insulating film provided over the semiconductor substrate, source and drain electrodes provided on the active region, and a gate electrode, located between the source and drain electrodes, including a lower electrode portion for providing a Schottky barrier contact with the active region through an opening of the insulating film, and an upper electrode portion provided on the insulating film to extend toward only the drain electrode.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 3 is a sectional view showing a MESFET (Metal Semiconductor Field Effect Transistor) according to a second embodiment of the present invention;

DETAILED DESCRIPTION OF THE PREFERRED EMBODIMENTS

Figure 1:
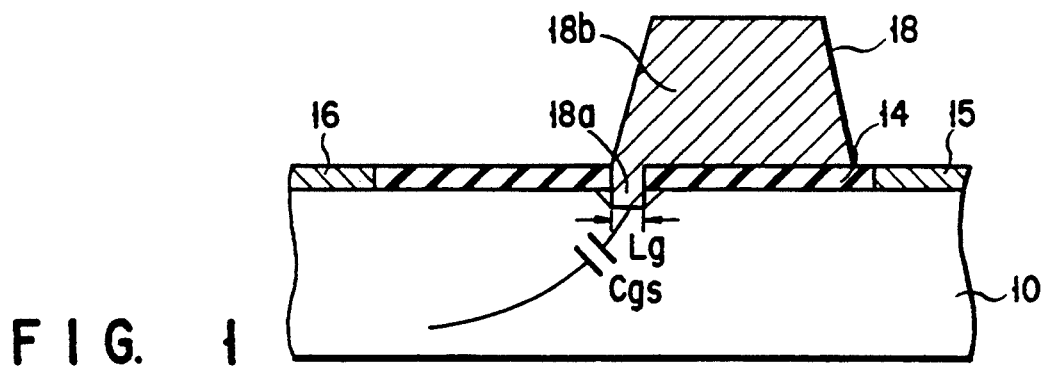
FIG. 1 is a sectional view schematically showing a HEMT (High Electron Mobility Transistor) according to a first embodiment of the present invention.

Embodiments of the present invention will be described below with reference to the accompanying drawings.

A first embodiment of the present invention will be first described. The same reference numerals denote the same parts throughout the drawings.

FIG. 1 is a sectional view schematically showing a HEMT (High Electron Mobility Transistor) to which an electrode structure of the present invention is applied.

The transistor comprises a semi-insulating GaAs substrate 10 including an active region (not shown), drain and source electrodes 15 and 16 provided on the substrate 10, an insulating film 14 formed between the drain and source electrodes 15 and 16, and a gate electrode 18 provided on the insulating film 14 and being in a Schottky barrier contact with the active region through an opening of the insulating film 14. In this case, the gate electrode 18 includes a lower electrode portion 18a determining a gate length Lg, and an upper electrode portion 18b provided on the $SiO_2$ film 14 to be continuous with the lower electrode portion 18a. The upper electrode portion 18b is disposed at only one side of the drain electrode 15. Since the upper electrode portion 18b is not located above the side of the source electrode 16, the increase $\Delta C$ of the gate-source capacitance Cgs, closely associated with the high-frequency noise figure NF, can be reduced to zero.

A method of making the HEMT will be described with reference to FIGS. 2A to 2H.

Figure 2A:
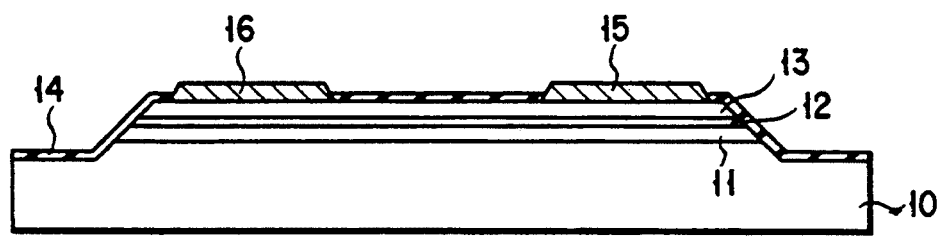
FIGS. 2A to 2H are sectional views showing the steps in manufacturing the HEMT according to the first embodiment of the present invention.

As shown in FIG. 2A, the epitaxial structure of the HEMT is formed by sequentially growing the following layers on the semi-insulating GaAs substrate 10: a 5,000 Å thick undoped GaAs layer 11, a 30 Å thick undoped AlGaAs layer (not shown), a 300 Å thick Si-doped ($2 \times 10^{18}$ cm$^{-1}$) n-type AlGaAs layer 12, and a 1000 Å thick Si-doped ($3 \times 10^{18}$ cm$^{-1}$) n-type GaAs layer 13. In this case, as is well known, a two-dimensional electron gas (not shown) is provided at the side of the undoped GaAs layer 11 of the GaAs/AlGaAs junction interface. The substrate is subjected to mesa-etching for isolation to set a device active region. Thereafter, an $SiO_2$ film 14 is deposited over the entire surface of the substrate surface to a thickness of 2,000 Å by means of CVD techniques. Drain and source electrodes 15 and 16 are provided on the active layer so as to be coupled to the two-dimensional electron gas.

Figure 2B:
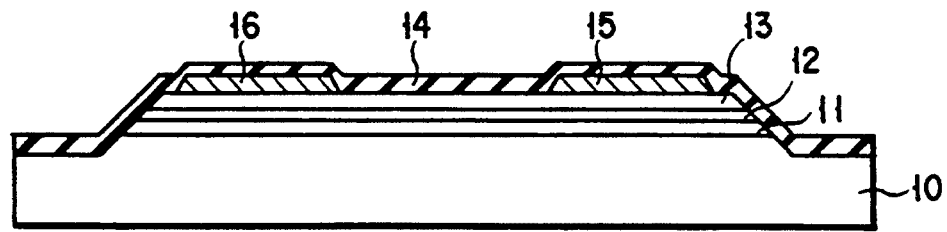

The drain and source electrodes 15 and 16 are formed as follows. After the $SiO_2$ film 14 is coated with a resist film, opening patterns for the drain and source electrodes 15 and 16 are formed therein. Thereafter, the exposed portions of the $SiO_2$ film 14 are removed by a diluted HF solution. Au-Ge alloy (Ge 12 wt %) and Ni are sequentially deposited on the exposed substrate surface to thicknesses of 2,000 Å and 400 Å, respectively, to provide ohmic metal layers. After unnecessary metal portion is lifted off together with the resist layer, the substrate is annealed using, e.g., a halogen lamp (in $N_2$, at 500° C., for 5 sec), thereby providing the drain and source electrodes 15 and 16. In this case, after the drain and source electrodes 15 and 16 are provided, an $SiO_2$ film 14 is again formed on the substrate surface including the drain and source electrodes 15 and 16, as shown in FIG. 2B.

Figure 2C:
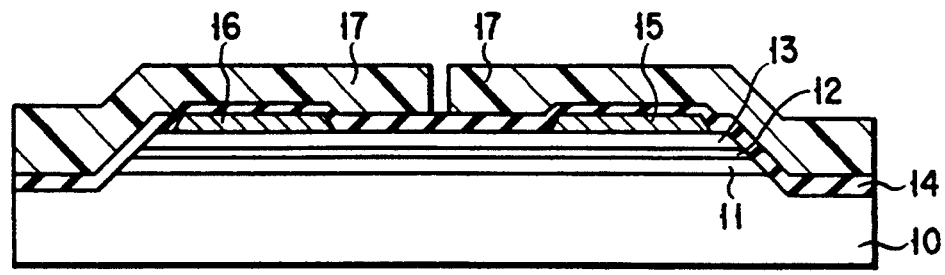

As shown in FIG. 2C, after a resist layer 17 for EB (electron beam) lithography is coated on the substrate surface to a thickness of about 0.3 μm, an opening pattern having a width of 0.1 μm is formed therein at a gate electrode region by EB lithography techniques. Thereafter, the $SiO_2$ film 14 is removed by RIE (Reactive Ion Etching) techniques under the condition of $CF_4/O_2 = 100/10$ (SCCM) and a power of 100W, using the patterned resist layer 17 as a mask.

Figure 2D:
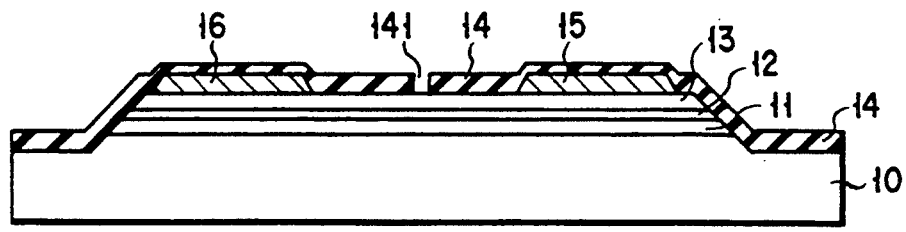

As shown in FIG. 2D, the resist layer 17 is removed by an $O_2$ plasma treatment. The gate length Lg and the lower electrode portion 18a are determined by an opening portion 141 formed in the $SiO_2$ film 14.

Figure 2E:
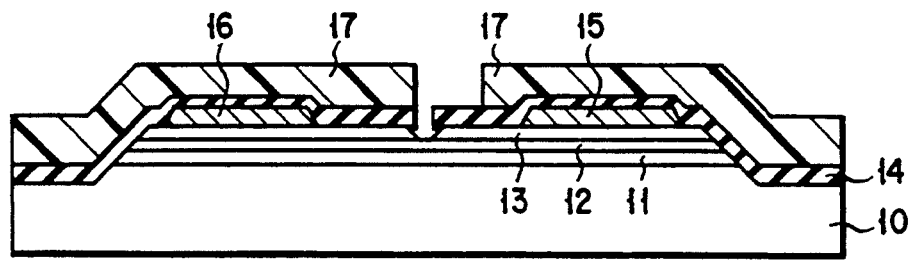

As shown in FIG. 2E, a resist layer 17 is coated again on the substrate surface, and an opening pattern is formed therein so as to expose the gate electrode region by means of EB lithography techniques. In this case, the opening is wider than the opening of the $SiO_2$ film 14 shown in FIG. 2D, and extends toward only the drain electrode 15. The n-type GaAs layer 13 exposed through the opening of the $SiO_2$ film 14 is then removed by using a phosphoric acid etchant. Therefore, a portion for the lower electrode portion 18a of the gate electrode 18 is provided for making directly a Schottky barrier with the n-type AlGaAs layer 12. A region for the upper electrode portion 18b of the gate electrode 18 corresponds to the opening of the resist layer 17.

Figure 2F:
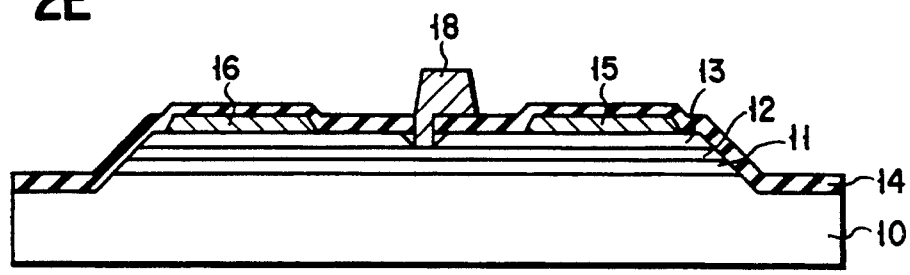

As shown in FIG. 2F, Ti (a thickness of 1,000 Å), Pt (a thickness of 400 Å), and Au (a thickness of 5,000 Å) are sequentially deposited on the substrate surface and the gate electrode 18 having the lower and upper electrode portions 18a and 18b is provided by lifting off the residual resist layer 17.

Figure 2G:
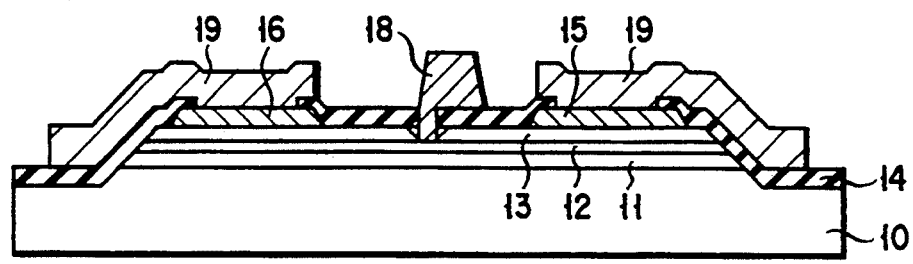

As shown in FIG. 2G, Ti (a thickness of 1,000 Å), Pt (a thickness of 4,000 Å), and Au (a thickness of 10,000 Å) are sequentially deposited on the substrate surface to provide pad electrodes 19 over the drain and source electrodes.

Figure 2H:
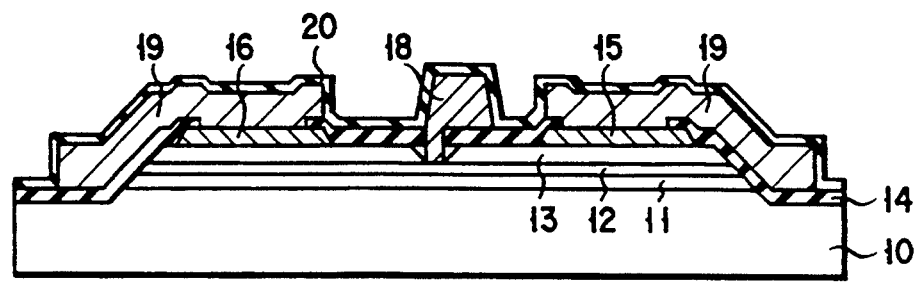
Figure 4:
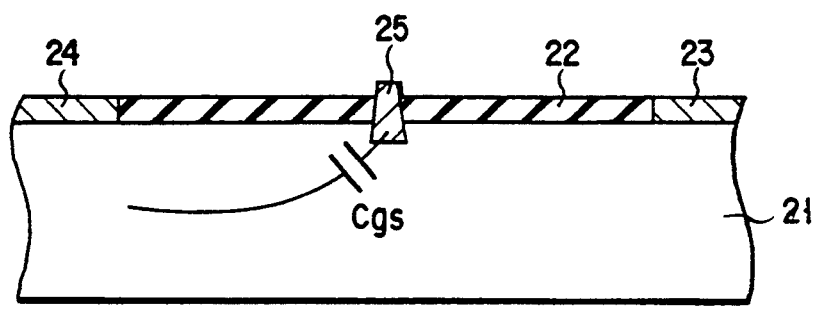
FIG. 4 is a sectional view schematically showing a conventional compound semiconductor field effect transistor.
Figure 5:
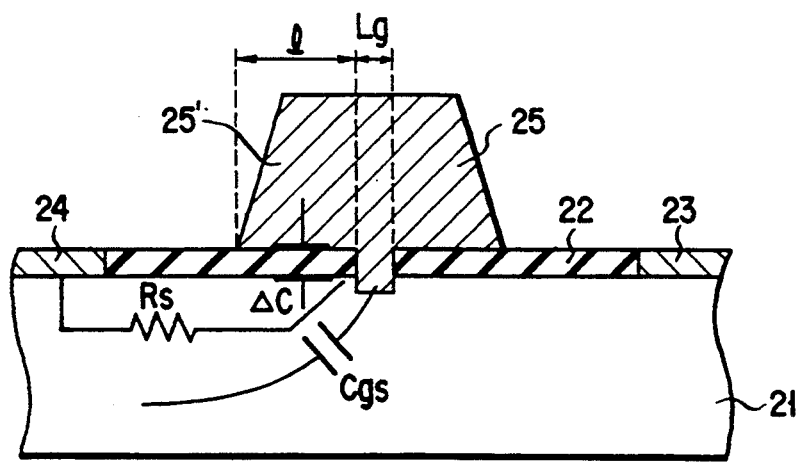
FIG. 5 is a sectional view schematically showing another conventional compound semiconductor field effect transistor having a gate electrode with a T-shaped cross-section.

Finally, as shown in FIG. 2H, plasma $SiN_X$ is deposited over the substrate surface to a thickness of about 1,000 Å to form a passivation film 20.

A second embodiment of the present invention will be described.

FIG. 3 is a sectional view showing a MESFET (Metal Semiconductor Field Effect Transistor) to which an electrode structure of the present invention is applied.

A MESFET 30 includes source and drain regions 33 and 34 formed by implanting, e.g., Si ions into a semi-insulating GaAs substrate 31, and a channel region 35 disposed between the source and drain regions 33 and 34 by implantation of Si ions. Ohmic electrodes 36 and 37 consisting of an Au—Ge alloy are formed in the source and drain regions 33 and 34 through opening portions formed in an insulating film 32 such as an oxide or nitride film covering the substrate surface, and a Schottky gate electrode 38 consisting of a Ti—Pt—Au layer is provided on the channel region 35. Similar to the first embodiment, the Schottky gate electrode 38 includes a lower electrode portion 38a determining a gate length Lg, and an upper electrode portion 38b provided on the insulating film 32 to be continuous with the lower electrode portion 38a. The upper electrode portion 38b is located at only the side of the drain electrode 37.

As has been described above, according to the compound semiconductor field effect transistor having the gate electrode of the present invention, the upper electrode portion of the gate electrode is provided on the insulating film at only the side of the drain electrode side. Since the upper electrode portion is not located on the insulation film at the side of the source electrode, the gate-source capacitance Cgs, which affects the high-frequency noise figure NF, can be reduced. Therefore, even with a small gate length, there is provided a gate electrode which can suppress the increase in the gate resistance and prevent the increase in the gate-source capacitance.

It is further understood by those skilled in the art that the foregoing description is only of the preferred embodiments and that various changes and modifications may be made in the invention without departing from the spirit and scope thereof.

What is claimed is:

1. A compound semiconductor device comprising:
    a compound semiconductor substrate having an active region;
    an insulating film on the active region;
    a recess having a bottom surface formed in the active region through an opening in the insulating film, a length of the bottom surface measured between the sidewalls of the recess substantially defining a gate length;
    source and drain electrodes on the active region;
    a gate electrode located between the source and drain electrodes, and including lower and upper gate electrode portions;
    the lower gate electrode portion having said gate length being in the recess of the active region to form a Schottky barrier contact with the active region, and
    the upper gate electrode portion on the insulating film and extending only toward the drain electrode.

2. The compound semiconductor device according to claim 1, wherein the upper gate electrode portion has an asymmetric cross-sectional shape with respect to the lower gate electrode portion.

3. The compound semiconductor device according to claim 2, wherein channel area formed under the recess of the active region.

* * * * *